(12) United States Patent
Kurt et al.

(10) Patent No.: US 9,977,169 B2
(45) Date of Patent: May 22, 2018

(54) LAMP FOR LASER APPLICATIONS

(75) Inventors: Ralph Kurt, Eindhoven (NL); Ronald Reindert Drenten, Eindhoven (NL); Elvira Johanna Maria Paulussen, Reppel-Bocholt (BE); Adriaan Valster, Waalre (NL); Denis Fournier, Lyons (FR)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 1254 days.

(21) Appl. No.: 13/263,634

(22) PCT Filed: Apr. 1, 2010

(86) PCT No.: PCT/IB2010/051431
§ 371 (c)(1),
(2), (4) Date: Oct. 7, 2011

(87) PCT Pub. No.: WO2010/116305
PCT Pub. Date: Oct. 14, 2010

(65) Prior Publication Data
US 2012/0026721 A1    Feb. 2, 2012

(30) Foreign Application Priority Data
Apr. 9, 2009    (EP) ..................................... 09305303

(51) Int. Cl.
| | |
|---|---|
| *F21V 9/16* | (2006.01) |
| *F21V 8/00* | (2006.01) |
| *F21S 8/10* | (2006.01) |
| *F21K 9/64* | (2016.01) |
| *F21Y 115/30* | (2016.01) |
| *F21Y 115/10* | (2016.01) |

(52) U.S. Cl.
CPC .............. *G02B 6/0003* (2013.01); *F21K 9/64* (2016.08); *F21S 48/115* (2013.01);
(Continued)

(58) Field of Classification Search
CPC ........ G02B 6/0003; F21S 48/115; F21K 9/56; F21V 9/16
(Continued)

(56) References Cited

U.S. PATENT DOCUMENTS 6,350,041 B1 *  2/2002  Tarsa et al. .................... 362/231
6,504,301 B1 *  1/2003  Lowery ..................... F21V 9/00
                                        257/E25.02
(Continued)

FOREIGN PATENT DOCUMENTS

| JP | 2000275444 A | 10/2000 |
| JP | 2008124114 A | 5/2008 |

(Continued)

*Primary Examiner* — Jason Moon Han

(57) ABSTRACT

A lamp and a method for generating high power in laser applications includes a source for emitting optical radiation along an optical path and a holder configured in the optical path having a fluorescent body. The lamp and method further include a collecting unit configured to transmit at least a portion of the optical radiation emitted by the fluorescent body to an output of the lamp. The fluorescent body includes a shape that is elongated in a predetermined direction. Accordingly, providing a small spot and little divergence in conjunction with good heat dissipation leads to a high optical performance.

19 Claims, 5 Drawing Sheets

(52) U.S. Cl.
CPC ............. *F21S 48/1145* (2013.01); *F21V 9/16* (2013.01); *F21S 48/1323* (2013.01); *F21S 48/328* (2013.01); *F21Y 2115/10* (2016.08); *F21Y 2115/30* (2016.08); *H01L 2924/0002* (2013.01)

(58) Field of Classification Search
USPC ............. 362/84, 259, 293, 311.02, 553, 800
See application file for complete search history.

(56) References Cited

U.S. PATENT DOCUMENTS

| | | | |
|---|---|---|---|
| 7,040,774 B2* | 5/2006 | Beeson | G02B 17/0668 362/257 |
| 7,165,871 B2 | 1/2007 | Takeda et al. | |
| 7,422,356 B2* | 9/2008 | Hama | A61B 1/0653 362/129 |
| 8,251,538 B2 | 8/2012 | Samber | |
| 2005/0105301 A1 | 5/2005 | Takeda et al. | |
| 2005/0269582 A1 | 12/2005 | Mueller | |
| 2008/0030993 A1 | 2/2008 | Narendran et al. | |
| 2010/0149814 A1* | 6/2010 | Zhai et al. | 362/293 |

FOREIGN PATENT DOCUMENTS

| | | |
|---|---|---|
| WO | 2006054199 A1 | 5/2006 |
| WO | 2007044472 A2 | 4/2007 |
| WO | 2008007232 A2 | 1/2008 |
| WO | 2008017968 A2 | 2/2008 |
| WO | 2008079161 A1 | 7/2008 |

* cited by examiner

LAMP FOR LASER APPLICATIONS

FIELD OF THE INVENTION

The invention relates to the field of lamps adapted for laser applications. The invention also relates to the field of methods adapted for laser applications. The invention is preferably adapted for high power laser applications and/or for lighting applications.

BACKGROUND OF THE INVENTION

U.S. Pat. No. 7,165,871 B2 describes a lamp for generating light which comprises a semiconductor light emitting element for emitting light, a fluorescent material, provided away from the semiconductor light emitting element, a first optical member operable to focus the light generated by the semiconductor light emitting element on the fluorescent material, and a second optical member having an optical center at a position where the fluorescent material is provided, operable to emit light from the fluorescent material based on the light focused by the optical member to an outside of the lamp. The lamp is used as a headlamp in a vehicle, and the second optical member emits the light from the fluorescent material to the outside of the lamp, so that the second optical member forms at least one of a part of a cut line that defines a boundary between a bright region and a dark region of the headlamp. This document further describes the combination of a laser, a phosphor and a reflector integrated into a light emitting module used for automotive front light applications. Such lasers usually deliver pencil-shaped beams originating from a small spot and showing little divergence. Very local heat dissipation in the fluorescent material appears and thus limits the brightness of such a lamp.

During the last decades, light emitting diodes, LEDs for short, have become more and more important in lighting applications due to the advances of semiconductor technology. High-power LEDs have opened the door to new lighting concepts comprising miniaturization, lifetime, efficiency and sustainability of the optical elements.

Lasers show a much higher brightness than LEDs. Semiconductor lasers showing output powers in the range of several Watts are available and thus enable a high lumen output. Currently, laser pumped optical lamps for different potential lighting applications are investigated. It is expected that they show a high potential for dedicated lighting applications such as spots for automotive, architectural indoor, outdoor and accent lighting.

However, there is a need to utilize the strong quality of lasers comprising their high brightness and keeping their optical performance as high as possible in conjunction with solving the above-mentioned thermal issue problem.

SUMMARY OF THE INVENTION

It is the object of the invention to provide a possibility to improve optical performance in laser applications in conjunction with solving the thermal issue problem mentioned above in order to mitigate heat accumulation in a fluorescent body and thus to improve heat transport through a transparent body which comprises the fluorescent body.

This object is achieved by the subject matter of the independent claims. Preferred embodiments are defined in the sub claims.

According to a first aspect of the invention, this object is achieved by a lamp comprising a source adapted for emitting optical radiation along an optical path and a holder comprising a fluorescent body, wherein the holder is arranged in the optical path, a collecting unit is provided which is adapted for transmitting at least a portion of optical radiation emitted by the fluorescent body to an output of the lamp, and the fluorescent body comprises a shape being elongated in a predetermined direction.

It is noted that the transparent body is also called holder in the following. It is an important idea of the invention that it becomes possible to improve heat transport through the holder.

According to a preferred embodiment of the invention, the holder is attached to the fluorescent body or arranged close to it and thus close to the hotspot. The arrangement of holder and fluorescent body preferably corresponds to a fiber. Preferably, the holder comprises a shape which is elongated in a predetermined direction which is equal to the predetermined direction of the elongated shape comprised by the fluorescent body. Preferably, the collecting unit comprises an optical center arranged in the holder. Preferably, a focusing unit is provided which is adapted for focusing the optical radiation emitted from the source onto at least a part of the fluorescent body. More preferably, the source corresponds to at least two sources each emitting optical radiation which is combined.

According to another preferred embodiment of the invention, the lamp further comprises a heat-spreader provided at the holder, wherein the heat-spreader is adapted for conducting heat irradiated from the fluorescent body to a sink. Preferably, the holder comprises a transmission, preferably an optical transmission, of ≥80%, more preferably of ≥90%, most preferably of ≥95%. Preferably, the holder comprises a thermal conductivity of ≥10 W/mK, more preferably of ≥40 W/mK, most preferably of ≥100 W/mK. According to another preferred embodiment of the invention the holder comprises a conductivity of ≥800 W/mK. Preferably, the holder comprises a wall thickness of ≥0.5 mm and/or ≤10 mm.

According to yet another preferred embodiment of the invention, the material of the holder comprises diamond, sapphire, ceramic and/or at least a part of a ceramic material. Preferably, the shape comprised by the holder corresponds to a rod, a fiber, a wire and/or a cylinder. Other shapes like a spherical shape, an aspherical shape, a Fresnel-shape, a diffractive shape, e.g. a periodic structure, or non-periodic structured shape. Also a combination these shapes is possible.

Preferably, the holder comprises the entire space within the collecting unit. Preferably, the rod comprises a diameter ≥1 mm and/or ≤10 mm. Preferably, the rod comprises a length ≥0.3 mm and/or ≤100 mm. Preferably, the rod corresponds to a thin elongated Lumiramic material, the term "Lumiramic" describing a phosphor technique of the applicant and being related to a material combination of a ceramic and a phosphor. The Lumiramic material is preferably encapsulated by a transparent heat-spreader.

According to yet another preferred embodiment of the invention, the fluorescent body comprises a fluorescent material that comprises a predetermined diameter and a length of 3 times the predetermined diameter, more preferably 5 times the predetermined diameter, most preferably 10 times the predetermined diameter. Preferably, the fluorescent material, comprised by the fluorescent body, comprises a Lumiramic material.

According to yet another preferred embodiment of the invention, the source is adapted for exciting fluorescent emission over a predefined length of the fluorescent material comprised by the fluorescent body. In this way different beam shapes can be realized. The source is preferably adapted for tuning the optical radiation emitted along the optical path. Preferably, the source comprises at least one of a light emitting diode and a laser. The light emitting diode preferably comprises an inorganic material and/or an organic material. The laser preferably comprises at least one of a semiconductor laser and a solid-state laser, more preferably a fiber laser.

According to a second aspect of the invention, this object is achieved by a method comprising the steps: a) emitting optical radiation along an optical path, b) transmitting at least a portion of optical radiation emitted by a fluorescent body, being provided in the optical path, to an output of the lamp according to the first aspect of the invention. The method is preferably adapted for generating high power at an output of a device.

It is worth noting that the invention provides a lamp adapted for generating light comprising a source, such as a semiconductor light emitting element, preferably an LED, or a laser, a fluorescent body is substantially embedded in a transparent body and is provided away from the source, such that the lamp shows a high optical performance. The focusing unit is preferably adapted for focusing light or optical radiation generated by the source onto the fluorescent body. According to another preferred embodiment of the invention, the focusing unit is adapted for focusing light or optical radiation generated by the source through the holder. It is advantageous that the holder is attached to the fluorescent body, such that this arrangement comprises a good thermal interface corresponding to a low thermal contact resistance. The attachment between holder and fluorescent body is preferably achieved by melting glass, ceramic glue, more preferably by transparent pressure ceramic or silicon thermal interface material. The fluorescent material preferably comprises a Lumiramic material, characterized by an efficient and high light conversion, a high thermal conductivity, such as k>6 W/mK at room temperature, a high thermal stability and/or highly scattering visible light. It is noted that, according to a preferred embodiment of the invention, the fraction of the laser power dissipated in the fluorescent body comprises a value ≥300 mW, more preferably ≥800 mW and most preferably ≥1.3 W.

Upon excitation with a single and/or with multiple laser pump beam(s) the fluorescent material is preferably characterized by a homogeneous radial emission at a different wavelength than the excitation wavelength, preferably in a plane perpendicular to the elongation direction of the fluorescent body. Preferably, the transparent body is thermally linked to a heat sink, for instance via heat pipes, via a heat conduction material or via a heat-spreader. The heat sink is preferably arranged on the opposite side of the collecting unit, also called reflector in the following. Most preferably, the housing of the reflector is used as a heat sink. The reflector is preferably a parabolic reflector or parabolic mirror.

It is worth noting that by scanning the fluorescent body with the optical radiation emitted by the source or by dynamically adjusting the scan area and/or the focus of the lamp spot, a dynamic tunable light spot can be achieved. According to another preferred embodiment of the invention, the focusing unit is preferably adapted for bending and/or for scanning the light generated by the source. Preferably, the lamp is adjustable to excite fluorescent emission over various parts or lengths of the fluorescent material. Thereby, different beam shapes can be realized. Most preferably, the filament shaped Lumiramic emitter comprises a plurality of segments, wherein each segment comprises a length of about 300 μm to 1 mm. In other words, a segmented luminescent body and/or a scanning laser beam are preferably used to realize a lamp adapted for generating a variable beam width. Therefore, while using a relatively simple mechanical setup different beam shapes adapted for different applications are realizable.

A segmented Lumiramic emitter arranged on an optical axis of a reflector comprising a parabolic shape, a Bezier type shape or any other shape can advantageously be used. The filament shaped Lumiramic emitter preferably comprises a plurality of segments, the plurality of segments being preferably separated by a highly scattering material, such as titanium dioxide, adapted for preventing optical cross talk between the plurality of segments. These segments can be connected by melting glass, ceramic glue or other techniques. In this way damaging by high power density of a laser can be countervailed. Each segment of the plurality of segments is preferably excited individually which is adapted for emitting visible light by a blue or UV pump laser. According to another preferred embodiment of the invention, white light is emitted. Preferably, the laser beam illuminates, for instance, four separate parts of a Lumiramic cylinder which leads to four different beam sizes. Preferably, the total length and the diameter of the Lumiramic cylinder correspond to 4 mm and 0.2 mm, respectively. According to yet another preferred embodiment of the invention, a scanning laser comprises a scanning mirror or a stepping motor, respectively.

The concept of the invention is especially adapted for being used in automotive applications, especially for front lights, where high and low beams are required, respectively. With respect to that, especially swiveling beams and "side-looking" light in case of turning left or right can be accomplished, too.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
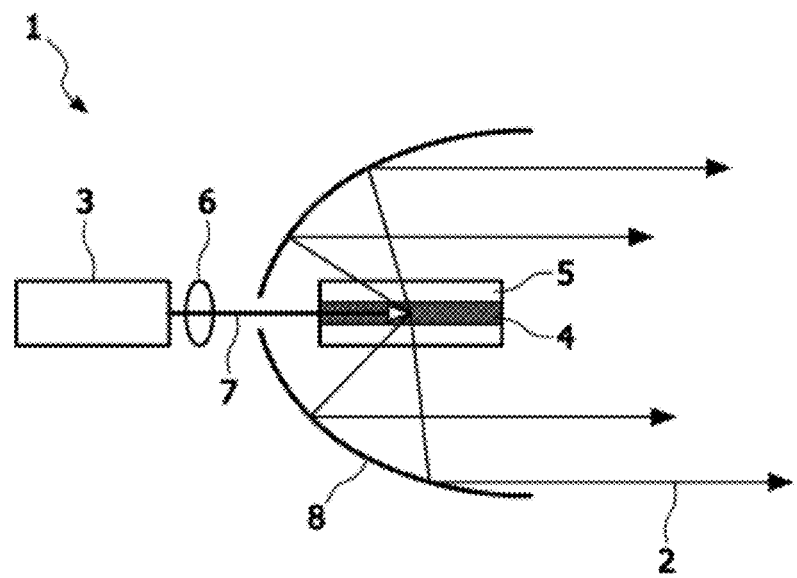
FIG. 1 shows a laser pumped lamp according to a first preferred embodiment of the invention.

FIG. 1 schematically illustrates a laser pumped lamp 1 according to a first preferred embodiment of the invention. The lamp 1 generates radiation. i.e. light 2, and comprises a source 3. A fluorescent body 4 is substantially embedded in a holder 5, wherein the holder 5 corresponds to a transparent body, and is provided away from the source 3. The source 3 is adapted for emitting optical radiation along an optical path and the holder 5 comprises the fluorescent body 4, wherein the holder 5 is arranged in the optical path. A collecting unit 8 is provided which is adapted for transmitting at least a portion of optical radiation emitted by the fluorescent body 4 to an output of the lamp 1. According to the first preferred embodiment of the invention, the collecting unit 8 corresponds to a parabolic reflector. As can be seen from FIG. 1, the fluorescent body 4 comprises a shape being elongated in a predetermined direction. According to the first preferred embodiment of the invention, a focusing unit 6 is provided which is adapted for focusing the optical radiation 7 emitted from the source 3 onto the fluorescent body 4. According to another preferred embodiment of the invention, the focusing unit 6 is adapted for focusing the radiation 7 through the holder 5. Furthermore, the holder 5 comprises a shape being elongated into the same predetermined direction as the elongated shape of the fluorescent body 4. The collecting unit 8 comprises an optical center arranged in the holder 5. According to the first preferred embodiment of the invention, the collecting unit 8 shows an optical center at a position where the fluorescent body 4 is provided. The collecting unit 8 is operable to emit radiation 2 coming from the fluorescent body 4 and irradiating through the holder 5 to an output of the lamp 1.

Figure 2:
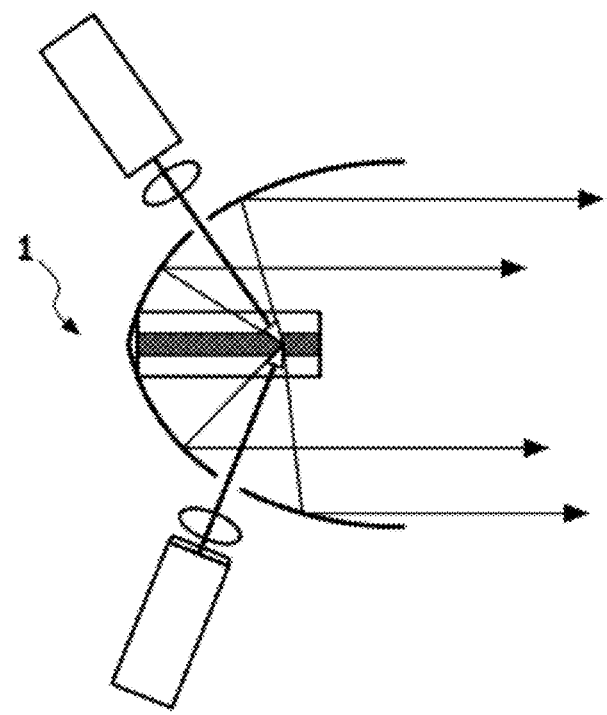
FIG. 2 shows a lamp comprising two pump lasers according to a second preferred embodiment of the invention.

FIG. 2 schematically illustrates the lamp 1 comprising two pump lasers according to a second preferred embodiment of the invention. The holder 5 shows an optical transmission of more than 80%. Furthermore, the holder 5 is characterized by a high thermal conductivity of k>10 W/mK. According to the second preferred embodiment of the invention, the holder 5 is attached to the fluorescent body 4 comprising a good thermal interface, in other words the attachment between the fluorescent body 4 and the holder 5 comprises a low thermal contact resistance. This arrangement is obtainable by melting glass, ceramic glue, a transparent pressure ceramic or a silicon thermal interface material. According to another preferred embodiment of the invention, the fluorescent material is sintered inside the transparent holder 5. In other words, the holder 5 is a good thermal conductor since it acts as a heat-spreader.

Figure 3:
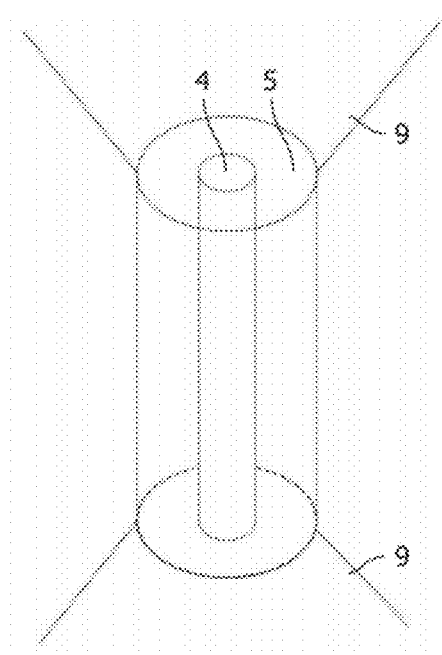
FIG. 3 schematically illustrates an elongated filament according to a third preferred embodiment of the invention.

FIG. 3 shows the holder 5 comprising the fluorescent body 4 according to a third preferred embodiment of the invention. The material of the holder 5 comprises diamond. The fluorescent body 4 corresponds to a Lumiramic cylinder. According to another preferred embodiment of the invention, preferably in lighting applications, the laser radiation has to be reshaped into a distribution required for a particular application. According to another preferred embodiment of the invention, preferably in automotive front light applications, it is beneficial to realize a preserving system that utilizes the high brightness of the lamp 1.

FIG. 3 illustrates an elongated filament according to the third preferred embodiment of the invention. FIG. 3 also shows a connection to a heat-spreader 9 which is provided and is adapted for conducting the heat from the filament, in particular from the holder 5, to a heat sink. In other words, the holder 5 is thermally linked to a heat sink via the heat-spreader 9, wherein the heat-spreader 9 is being arranged on the opposite side of the collecting unit 8. According to another preferred embodiment of the invention, the housing of the collecting unit 8 is used as heat sink.

Figure 4:
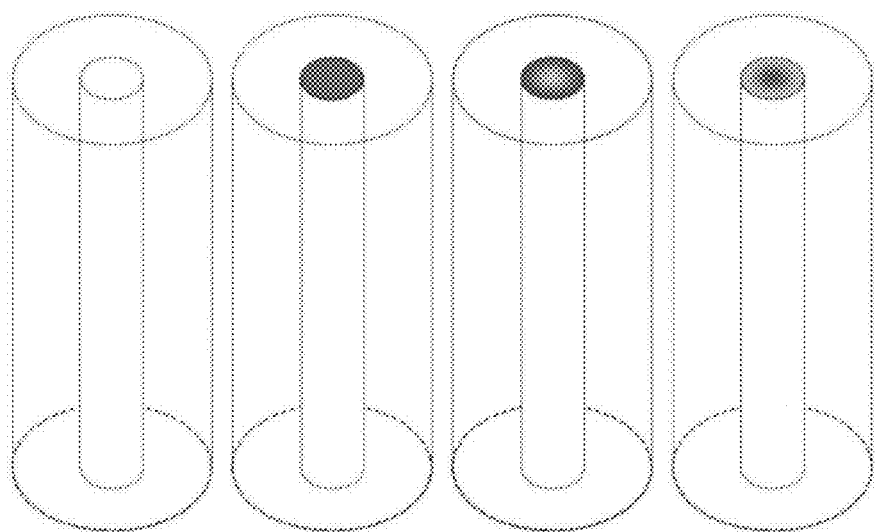
FIG. 4 shows isotropic phosphor density and also gradually increasing phosphor density in the fluorescent body according to a fourth preferred embodiment of the invention.

FIG. 4 illustrates the isotropic phosphor density in the fluorescent body 4 and also a gradually increasing phosphor density in the fluorescent body 4 according to the fourth preferred embodiment of the invention. According to the fourth preferred embodiment of the invention, the fluorescent body 4 comprises a material with a component resulting in a substantial light scattering inside the material. Upon excitation with a single or with multiple laser pump beam(s), the fluorescent material is further characterized by a substantially homogeneous radial emission in a plane perpendicular to the elongation direction of the fluorescent material at a wavelength different from the excitation wavelength. According to the fourth preferred embodiment of the invention, the fraction of laser power dissipated into the fluorescent body 4 is larger than 300 mW. As shown in the first picture of FIG. 4, the phosphor density in the fluorescent body is distributed isotropically. The second picture of FIG. 4 shows that the phosphor density in the fluorescent body 4 is distributed with a gradient in density achieved in the elongation direction of the fluorescent body 4. Such a configuration is very suitable if the source 3 is coupled in from the bottom side. The gradient is preferably realized in a way that the generated fluorescent radiation intensity follows substantially a linear function. According to another preferred embodiment of the invention, the generated fluorescent radiation intensity is constant. According to yet another preferred embodiment of the invention, there is a gradient in scattering of fluorescent material provided which increases in the direction of the laser beam emitted from the source 3. This is realized by gradually increasing the concentration of titanium dioxide particles in the material. The third picture of FIG. 4 shows a gradient in density achieved in the radial direction of the fluorescent material comprising the highest density at the outer rim of the fluorescent body 4. Such a configuration is highly suitable, if the laser is focused onto the fluorescent body 4 from the outside through the transparent holder 5. According to the fourth preferred embodiment of the invention, the holder 5 is very close to the hot spot allowing a good heat transport. The fourth picture of FIG. 4 shows a gradient in density achieved in the radial direction of the fluorescent material comprising the highest density in the center of the fluorescent body 4.

According to other preferred embodiments of the invention, a dichroic coating is provided. The dichroic coating is provided on one side of the fluorescent body 4 to prevent light at a wavelength different from the excitation wavelength to pass back in the direction of the pump laser. The laser light, on the other hand, passes the dichroic coating which is provided on the lower side of the fluorescent body 4 as shown in FIG. 4. This is the side of the entrance of the laser beam. The use of a dichroic coating can generally be combined with any other embodiment of the invention.

Figure 5:
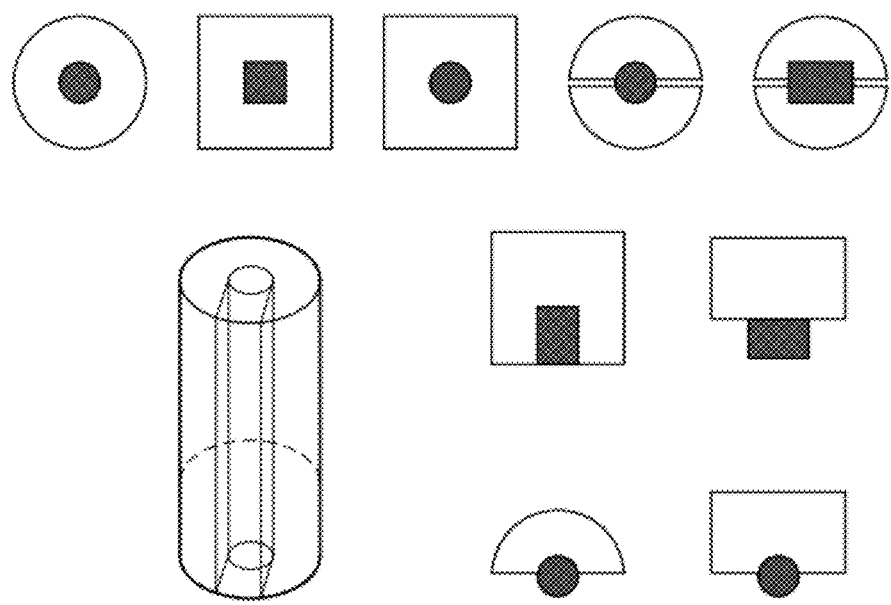
FIG. 5 shows different possibilities of encapsulating the fluorescent body into the transparent holder according to a fifth preferred embodiment of the invention.

FIG. 5 shows different examples of encapsulating the fluorescent body 4 into the holder 5 according to a fifth preferred embodiment of the invention.

Figure 6:
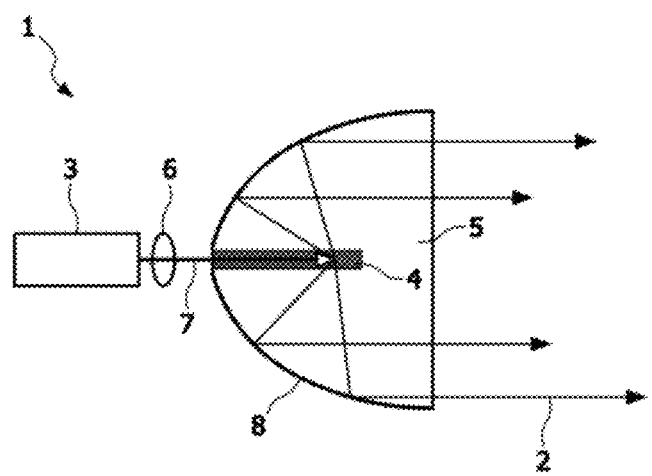
FIG. 6 shows a lamp comprising a transparent holder which essentially fills up the entire space between the fluorescent body and the collecting unit according to a sixth preferred embodiment of the invention.

FIG. 6 shows that the transparent holder 5 essentially fills up the space between the fluorescent body 4 and the collecting unit 8 according to a sixth preferred embodiment of the invention. The shape of holder 5 is not elongated. The reflection of light or radiation at a wavelength different from the excitation wavelength arranged at the collecting unit 8 is realized by total internal refraction, TIR for short, or by a reflector or by a dichroic coating, according to other preferred embodiments of the invention. The latter is preferably capable to reflect visible light by IR radiation above 900 nm that is going to be transmitted. Alternatively, an extra lens behind the reflector and the rod is possible, too. According to the sixth preferred embodiment of the invention, the collecting unit 8 corresponds to a parabolic reflector adapted for collecting at least a part of the radiation and reflects the part of radiation into a predetermined direction.

Figure 7:
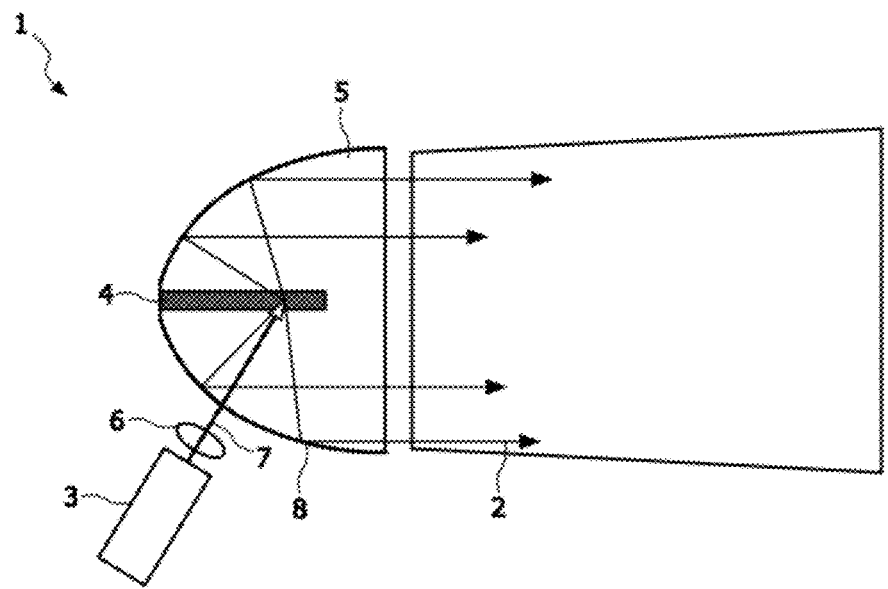
FIG. 7 shows a laser pumped lamp comprising a small laser spot mode according to a seventh preferred embodiment of the invention.
Figure 8:
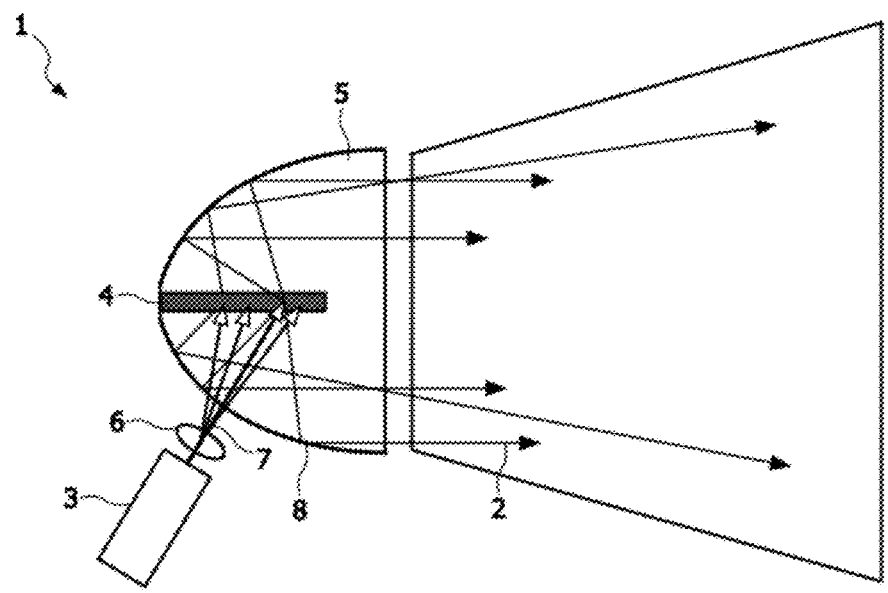
FIG. 8 shows a laser pumped lamp comprising a broad laser spot mode according to an eighth preferred embodiment of the invention.
Figure 9:
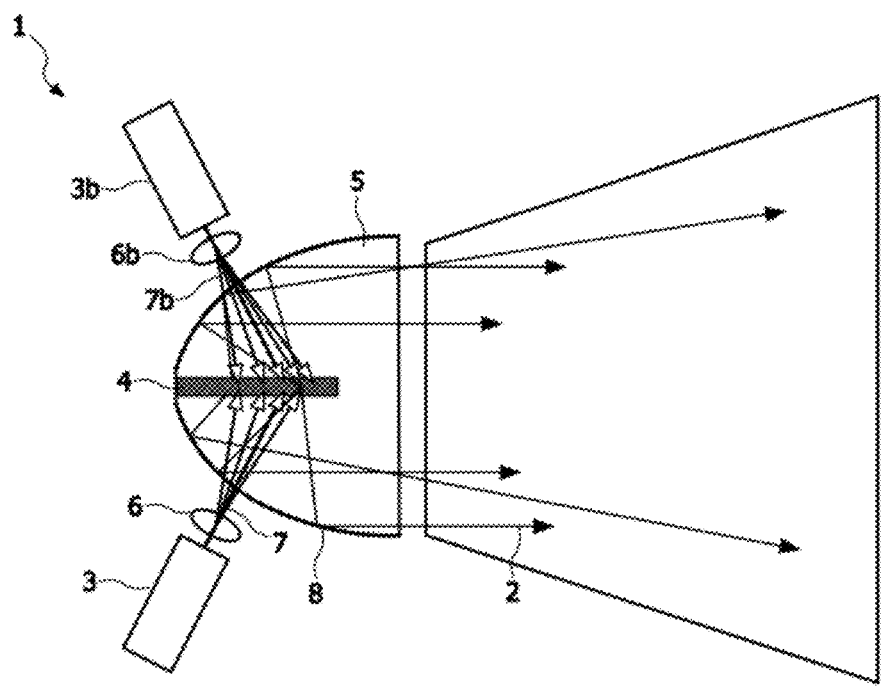
FIG. 9 shows a lamp comprising two pump lasers according to a ninth preferred embodiment of the invention.

FIG. 7, FIG. 8 and FIG. 9 show several preferred embodiments of the invention. FIG. 7 shows a laser pumped lamp 1 operating in a small laser spot mode resulting in a first predefined beam shape of the lamp 1. According to the seventh preferred embodiment of the invention, the beam shape corresponds to a narrow beam. FIG. 8 illustrates the laser pumped lamp 1 operating in a broad laser spot mode resulting in a second predefined beam shape of the lamp 1. According to the eighth preferred embodiment of the invention, the beam shape corresponds to a wash beam. FIG. 9 shows a lamp 1 comprising two pump lasers 3, 3b according to the ninth preferred embodiment of the invention.

Figure 10:
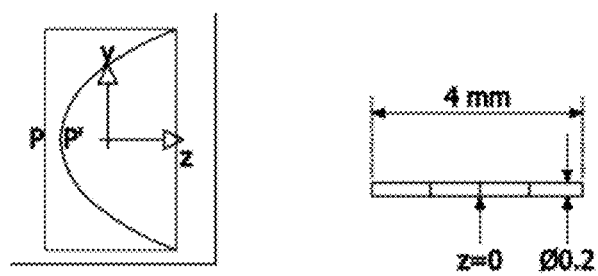
FIG. 10 shows a segmented Lumiramic emitter (right) arranged on an optical axis of a parabolic shaped reflector (left) according to a tenth preferred embodiment of the invention.

The right part of FIG. 10 illustrates a segmented Lumiramic emitter arranged on an optical axis of a parabolic shaped reflector according to the tenth preferred embodiment of the invention. According to other preferred embodiments of the invention, the shape of the reflector comprises a Bezier type shape. The filament shaped Lumiramic emitter comprises a plurality of segments, each segment comprises a length of about 300 μm. The plurality of segments is separated by a highly scattering material such as titanium dioxide to prevent optical cross talk between the plurality of segments. Each segment of the plurality of segments is excited individually to emit visible light by a blue pump laser. According to other preferred embodiments of the invention, white light is emitted. For a parabolic shaped reflector geometry, as illustrated in the left part of FIG. 10, a beam shape calculation is performed. The calculation is based on the assumption that the segmented Lumiramic emitter is positioned on an optical axis of this reflector and that different segments are emitting. The right part in FIG. 10 shows the case that a laser beam illuminates four separate parts of a Lumiramic cylinder which leads to four different beam sizes. The total length and the diameter of the Lumiramic cylinder correspond to 4 mm and 0.2 mm, respectively. The left part in FIG. 10 shows the case for a scanning laser comprising a scanning mirror or a stepping motor, respectively. A lens on a rotating disc, i.e. a de-centered lens can be used, too. According to the tenth preferred embodiment of the invention, the reflector with a Lumiramic cylinder source shows a parabolic shape.

It goes without saying that a homogeneous wide beam is realizable by the inventive lamp. It is also possible that the laser beam is scanned or widened over the Lumiramic filament resulting in slight changes in the beam profile.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lamp comprising:
   a laser source configured to emit an optical radiation along an optical path;
   a fluorescent body, cylindrical in shape and elongated in a predetermined direction;
   a transparent holder surrounding the fluorescent body along its entire length in the predetermined direction, wherein the holder has a high thermal conductivity and is arranged in the optical path;
   a collecting unit configured to transmit at least a portion of the optical radiation emitted by the fluorescent body to an output of the lamp; and,
   wherein the collecting unit is parabolic shaped and the transparent holder is contained in the collecting unit.

2. The lamp according to claim 1, wherein the fluorescent body further comprises a fluorescent material that has a predetermined diameter and a length being one of ≥3 times the predetermined diameter, ≥5 times the predetermined diameter, and ≥10 times the predetermined diameter.

3. The lamp according to claim 2, wherein the fluorescent material comprises a Lumiramic material.

4. A lamp comprising:
   a laser source configured to emit an optical radiation along an optical path;
   a transparent holder comprising a fluorescent body, wherein the holder has a high thermal conductivity and is arranged in the optical path; and
   a collecting unit configured to transmit at least a portion of the optical radiation emitted by the fluorescent body to an output of the lamp;
   wherein the collecting unit is parabolic shaped and the transparent holder is contained in the collecting unit;
   wherein the fluorescent body comprises an elongated shape in a predetermined direction, and the holder comprises a shape being elongated in a predetermined direction which is equal to the predetermined direction of the elongated shape of the fluorescent body; and
   wherein the holder and the fluorescent body have the same length and terminate at a same distance as measured from the laser source along the predetermined direction.

5. The lamp according to claim 4, further comprising a focusing unit configured to focus the optical radiation emitted from the source onto at least a part of the fluorescent body.

6. The lamp according to claim 4, further comprising a heat-spreader provided at the holder, wherein the heat-spreader is configured to conduct heat irradiated from the fluorescent body to a heat sink.

7. The lamp according to claim 6, wherein a housing of the collecting unit is configured to be the heat sink.

8. The lamp according to claim 4, wherein the holder has one of an optical transmission of ≥80%, of ≥90%, and of ≥95%.

9. The lamp according to claim 4, wherein the holder has one of a thermal conductivity of ≥10 W/mK, of ≥40 W/mK, of ≥100 W/mK, and of ≥800 W/mK.

10. The lamp according to claim 4, wherein the holder has a wall thickness being ≥0.5 mm and ≤10 mm.

11. The lamp according to claim 4, wherein a material of the holder comprises one of a diamond, a sapphire, and a ceramic material.

12. The lamp according to claim 4, wherein a shape of the holder corresponds to one of a rod, a fiber and a cylinder.

13. The lamp according to claim 12, wherein the rod has a diameter being ≥1 mm and ≤10 mm.

14. The lamp according to claim 12, wherein the rod has a length being ≥0.3 mm and ≤100 mm.

15. The lamp according to claim 12, wherein the rod is a thin elongated Lumiramic material.

16. The lamp according to claim 4, wherein the holder and the fluorescent body are configured to be spaced away from the light source.

17. The lamp according to claim 4 wherein the holder is configured to be attached to the fluorescent body in an arrangement, wherein the arrangement is configured to provide a thermal interface with a reduced thermal contact resistance, and wherein the arrangement is further configured to provide the holder with an increased thermal conductivity.

18. The lamp of claim 4 wherein the fluorescent body has a cylindrical shape and is capable of retaining its shape independently of physical constraints imposed on it by the holder.

19. A method for using a laser pumped lamp comprising the acts of:
    emitting laser pumped optical radiation along an optical path by a source; and
    transmitting at least a portion of the optical radiation emitted by a fluorescent body provided in the optical path to an output of a lamp by a collecting unit, wherein the fluorescent body includes a holder having a high thermal conductivity;
    wherein the fluorescent body is cylindrical in shape and comprises an elongated shape in a predetermined direction and wherein a transparent holder surrounds the fluorescent body along its entire length in the predetermined direction, and
    wherein the collecting unit is parabolic shaped and the holder is contained in the collecting unit.

* * * * *